United States Patent [19]

Braun et al.

[11] 4,056,302

[45] Nov. 1, 1977

[54] ELECTRICAL CONNECTION STRUCTURE AND METHOD

[75] Inventors: Roland Joseph Braun, Vestal; William Ditlef von Voss, Endicott, both of N.Y.

[73] Assignee: International Business Machines Corporation, Armonk, N.Y.

[21] Appl. No.: 693,051

[22] Filed: June 4, 1976

[51] Int. Cl.² ............................................... H01R 5/04
[52] U.S. Cl. .................................. 339/275 B; 29/629; 29/630 D
[58] Field of Search .................... 339/17, 275; 29/629, 29/630 D

[56] References Cited

U.S. PATENT DOCUMENTS

| 3,025,593 | 3/1962 | Mueller | 339/17 C |
| 3,133,774 | 5/1964 | Bulk et al. | 339/17 C |
| 3,548,369 | 12/1970 | Garver | 339/17 C |
| 3,573,707 | 4/1971 | Reynolds | 339/275 B |

OTHER PUBLICATIONS

IBM Bulletin, Ward, Solderless Module to Circuit Connection, 4/1976, p. 3588, vol. 18, No. 11.

*Primary Examiner*—Joseph H. McGlynn
*Attorney, Agent, or Firm*—Kenneth P. Johnson

[57] ABSTRACT

Surface connections of electrical component leads to circuit substrate lands are made with split sleeves on the lead ends, adjusted for contact with the lands, and soldered in position to join leads, sleeves, and lands.

8 Claims, 5 Drawing Figures

4,056,302

ELECTRICAL CONNECTION STRUCTURE AND METHOD

BACKGROUND OF THE INVENTION

The attachment of electrical components such as modules to circuit boards or cards is commonly done by inserting the component leads into holes in the card surface and soldering the junctions. This mode of attachment provides component stand-off which is highly desirable to permit circulation of cooling fluid about the components. As components and circuit cards are reduced in size by the continuing effort to miniaturize electronic packaging, lead and hole dimensions are also made smaller. The leads become less stable and there is greater difficulty in concurrently inserting the multiple leads into the respective holes. The solution to the assembly problem has been to forego lead insertion and attach the component leads to the surface of the circuit lands surrounding the small through holes.

Open circuits, however, frequently occur at the lead-land junctions when components such as modules having many leads are soldered. These open circuits are caused by failure of the solder to bridge the slight gaps between some leads and their respective lands. The gaps are usually due to small differences in the lengths of the leads or warpage of the circuit cards. When soldering is undertaken, the surface tension of the molten solder prevents bridging certain of the gaps resulting in an inoperative assembly and expensive rework. A further disadvantage is that in certain joints the solder may bridge the gaps but fail to produce fillets of adequate cross-section so that fracture of the weaker joints occurs in subsequent field usage.

It is accordingly a primary object of this invention to provide apparatus and method for electrical component attachment insuring that each component lead is in electrical contact with its respective land so that there are no unbridged gaps subsequent to soldering.

A further object of this invention is to provide connecting devices for attaching component leads to circuit lands which adjust to the extent required to eliminate any gaps between the leads and circuit lands.

A further object of this invention is to provide a method by which a plurality of parallel component leads may simultaneously be positioned in electrical contact with respective lands.

Another object of this invention is to provide conductive sleeves for component leads which frictionally engage the leads and are automatically adjusted along the leads to proper positions as the component is brought into position on the circuit card for soldering.

A still further object of this invention is to provide a split sleeve connector of conductive material which is slideable along a component lead to the desired position which is readily solderable to both the lead and circuit land.

SUMMARY OF THE INVENTION

The foregoing objects are attained in accordance with the invention by providing sleeves of solderable, electrically conductive material that can be concentrically placed on the ends of component leads. The sleeves extend beyond the free ends of the leads and are slideable therealong. The component is then brought into contact with the lands of the circuit card so that the leads substantially simultaneously contact their respective lands. The component is urged toward the lands forcing the sleeves to slide along the corresponding leads a distance determined by the separation between each lead and its land. As the component is held in place on the circuit card during soldering, the solder is provided an uninterrupted flow path along the land, sleeve and lead at each junction to assure uniform, reliable joints. The sleeves are preferably split so as to frictionally grip the leads and adapt to variable lead dimensions and cross-sections and to vent flux vapors from the joints. An alternative embodiment is to form the sleeves with internal teeth that can frictionally engage the component lead.

The sleeves are simple, inexpensive components and provide several advantages such as easy attachment to the leads, retention of position on the lead prior to soldering, and an improved reliability of solder joints. A sleeve has the further advantage of promoting wetting by the solder of the outer surface of the sleeve to improve solder fillet formation.

The foregoing and other objects, features, and advantages of the invention will be apparent in the following more particular description of preferred embodiments of the invention, as illustrated in the accompanying drawings.

DESCRIPTION OF THE PREFERRED EMBODIMENTS

Figure 1:
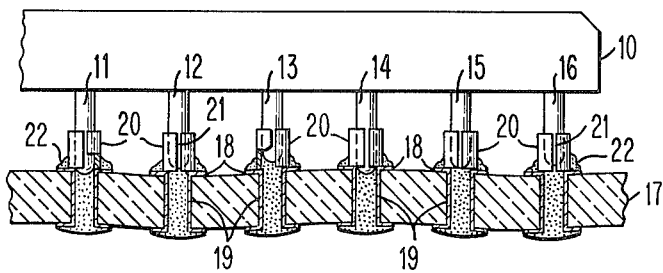
FIG. 1 is an elevation view, partially in section, illustrating the attachment of a circuit module and circuit card in accordance with the principles of the invention.

Referring to FIG. 1, a circuit module 10 having a plurality of depending, electrically conductive connecting leads or pins 11–16, is shown soldered to a circuit card 17 having electrically conductive lands 18 of thru-holes 19 corresponding to the component pins. It will be noted that the length of the pins is not uniform and that circuit card 17 has a warped surface. The result is that only certain of the pins make contact with their respective lands. The conditions illustrated, that is the variation in the length of the pins and the warpage of the card are shown somewhat exaggerated for purposes of explanation, but both of these conditions are commonly experienced either together or separately in the actual assembly of components on circuit substrates. The existence of non-uniformity of the pin length or card warpage alone are at times sufficiently severe that the pin ends do not contact the respective lands so that solder is unable to provide a structural and conductive joint. In the figure, it will be seen that the ends of pins 12, 13, 15 and 16 leave gaps of varying magnitude between corresponding land and end.

Should soldering of the pins to the lands be undertaken with such gaps, some pins would either not be connected to the lands, since the molten solder would fail to bridge the gap due to surface tension, or the bridging portion of the solder would form a connecting web too thin to sustain the vibration or stress of field usage. The illustrated module-circuit card assembly, of course, is that type in which only a surface connection is made as distinguished from the type which the pins are inserted in the thru-holes prior to soldering.

Figure 2:
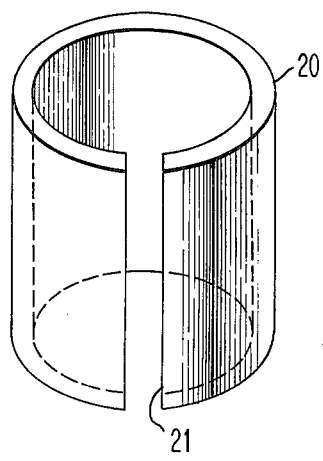
FIG. 2 is a perspective view of a split sleeve which may be used for the component attachment as shown in FIG. 1.

To overcome the problem of unsoldered joints or potentially weak joints, each pin end is fitted with a split sleeve 20, shown in greater detail in FIG. 2. The sleeves are preferably made with an internal diameter slightly less than the outside diameter of the leads or pins on which they are to be placed so there is a friction fit which still permits the sleeves to be pushed along the lead but remain in place upon removal of the pushing force. The sleeves are made of an electrically conductive material, preferably a hard copper, which has been pre-tinned. Other materials such as brass or Kovar may also be used. Wall thickness will vary according to the diameter of the pins on which the sleeves are to be placed. For example, with module heads of 0.6mm diameter, the sleeves may be made of materials from 0.05 to 0.15mm thickness and have an inside diameter of 0.5mm. The width of gap 21 may vary over a wide range and needs only to allow the sleeve to retain its position and provide a solder wetting path for attachment. The sleeve length is not critical but is preferably at least twice as long as the maximum expected gap so that the sleeve will stay in position during assembly and soldering.

Referring again to FIG. 1, the ends of the pins are each fitted with a split sleeve prior to assembly, and the sleeves are positioned so that the lower edges of the respective sleeves extend well beyond or approximately halfway below the pin ends. Thereafter, the module is brought into position on circuit card 17 so that all sleeves are substantially aligned with their respective circuit lands 18. Module 10 is pressed toward the circuit card until seated in position. This process causes the unattached split sleeves 20 to move upwardly along the pins an amount dictated by the proximity of the pin ends to the circuit lands. On those pins not in contact with the lands, the sleeves will provide a bridging structure. Soldering is then done to connect the pins, sleeves, and lands. The sleeves provide a flow path for the solder from the lands to the pin ends and are soldered to form a composite junction allowing the formation of sound fillets 22.

Figure 3:
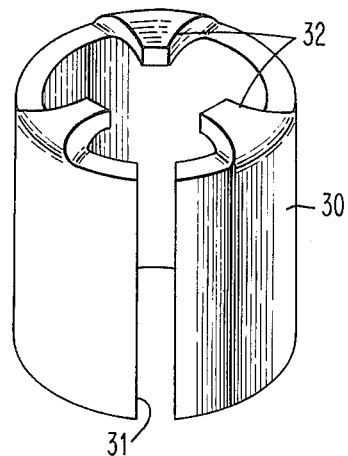
FIGS. 3, 4, and 5 are modifications of the split sleeve shown in FIG. 2 which may also be used for the attachment of electrical components to their circuit substrates.

In FIG. 3, there is shown a modified split sleeve 30 which has a plurality of integral projections 32 which are bent inwardly to form internal teeth across an end opening of the sleeve. These projections serve as the alternative frictional elements engaging the component leads and serve to grip through any film or oxide on the leads. These inwardly projecting tabs are kept relatively short so that the clearance between the inner sleeve wall and outside surface of the lead is on the order of 0.1 to 0.2mm. The split sleeve 30 is preferably made of the same material as the sleeve shown in FIG. 2, being a resilient, solderable metal. When internal teeth 32 are provided, the sleeve need not be split, if desired, since the sleeve and teeth can be sized so that the teeth deform sufficiently to accommodate the leads. In addition, internal tabs can be formed on both sleeve ends if desired.

Figure 4:
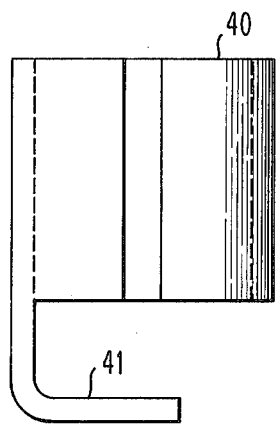
Figure 5:
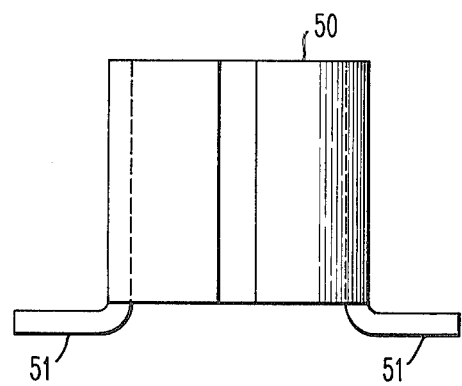

The sleeve embodiments shown in FIGS. 4 and 5 are variations of the sleeve shown in FIG. 2. In FIG. 4, split sleeve 40 has a single tab 41 formed thereon which is bent inwardly beneath the sleeve proper. This modification allows the sleeve to be attached to a land which is approximately of the same or smaller area than the cross-section of the component lead. In FIG. 5, split sleeve 50 has one or more outwardly projecting tabs 51 formed integrally with the sleeve. This configuration requires a larger land area than the sleeve diameter, and provides a greater solder area on the land.

The provision of sleeves which are slidable along a component lead solves the frequently experienced problem of leads of uneven length or warped circuit substrates. The sleeves, by being slideable along the component leads, are able to readily adjust to eliminate the existing gaps between the component leads and their respective lands. The sleeves serve as compact, inexpensive lead extenders which assure reliable circuit connections in a mass-produced assembly.

Although the component leads have been shown as being of circular cross-section, leads of square, rectangular or other cross-section may be present on the components. In most cases, cylindrical sleeves on such leads provide an adequate solder flow path at the contact areas between the sleeves and leads. Exact conformance of the sleeve to the lead configuration is not necessary for reliable solder joints.

While the invention has been particularly shown and described with reference to preferred embodiments thereof, it will be understood by those skilled in the art that the foregoing and other changes in form and details may be made therein without departing from the spirit and scope of the invention.

We claim:

1. In a circuit assembly, having a component with a plurality of interconnection pins adapted to be solder-connected to respective lands on a printed circuit card surface, the improvement comprising:

a plurality of electrically conductive sleeve connectors, one for each pin of said component and adapted to be variably slideably mounted thereon according to the distance between said pin and said respective land with at least one of said pins being in direct contact with its said land, to thereby assure electrical contact between each of said pins and the respective land on the surface of said printed circuit card to which the pin is to be connected, said connectors being exclusively on the surface of said card.

2. A device as described in claim 1 wherein said sleeve connectors have a longitudinal slit therein and are formed to define a cross-section similar to that of said pins and to frictionally grip said pins.

3. A device as described in claim 1 wherein each said sleeve connector is formed with a plurality of inwardly bent tabs grippingly engageable with said interconnection pin within said sleeve.

4. A device as described in claim 1 wherein said sleeve connectors each have a longitudinal slit therein throughout the length of said connector and said sleeve connectors frictionally grip each of said pins.

5. A device as described in claim 4 wherein each said sleeve connector has a plurality of inwardly bent tabs in gripping engagement with the said interconnection pin within said sleeve.

6. In a circuit module having a plurality of interconnection pins contained therein, adapted to the solder-connected to respective lands on a printed circuit board surface, the improvement comprising:

a plurality of electrically conductive sleeve connectors, one for each pin of said module, the inner surface of said connectors adapted to conform to the outer surface of said pins, each of said connectors having a slit in the vertical direction along the length of the connector, said connectors being adapted to be slideably mounted on respective pins according to the distance from said pin to said surface land of said module with at least one of said pins extending through the sleeve its said connector to thereby assure electrical contact between each of said pins and the respective land on the surface of the printed circuit board to which the pin is to be connected.

7. The method of joining a plurality of interconnection pins of a circuit module with respective surface lands of a circuit substrate comprising the steps of:

placing on each of said pins a sleeve frictionally engaging said pin and extending beyond the unattached end of said pin;

urging said module toward said substrate so that said sleeves engage said respective lands of said pins and slide axially along the pins until certain of said pins directly contact their said lands, and limit further motion, said sliding distances varying according to the distance of the pin ends from said lands; and soldering said sleeves to said lands and pins while said pins are aligned with said respective lands.

8. The method of claim 7 wherein said sleeves each have a longitudinal slit thereon.

* * * * *